United States Patent [19]

Narken et al.

[11] 4,411,972
[45] Oct. 25, 1983

[54] INTEGRATED CIRCUIT PHOTOMASK

[75] Inventors: Bernt Narken, Poughkeepsie; Henry C. Schick, Hopewell Junction, both of N.Y.

[73] Assignee: International Business Machines Corporation, Armonk, N.Y.

[21] Appl. No.: 336,005

[22] Filed: Dec. 30, 1981

[51] Int. Cl.³ .................. B32B 3/00; B32B 7/00; G03F 7/00

[52] U.S. Cl. .................. 430/5; 428/203; 428/209; 428/210; 428/212; 428/216; 428/218; 428/432; 428/433; 428/689; 428/702; 430/396

[58] Field of Search .......... 156/656, 667; 428/203, 428/209, 210, 689, 702, 195, 212, 213, 215, 216, 218, 426, 432, 433, 697, 701; 430/4, 5, 396

[56] References Cited

U.S. PATENT DOCUMENTS

| | | |
|---|---|---|
| 2,919,212 | 12/1959 | Gaiser . |
| 3,019,136 | 1/1962 | Auffenorde et al. . |
| 3,436,257 | 4/1969 | Myers . |
| 3,542,612 | 11/1970 | Cashau et al. . |
| 3,607,177 | 9/1971 | Robinson et al. . |
| 3,644,134 | 2/1972 | Widmann et al. . |
| 3,715,244 | 2/1973 | Szupillo . |
| 3,816,223 | 6/1974 | Ahn et al. . |
| 3,877,810 | 4/1975 | Feldstein . |
| 3,916,056 | 10/1975 | Feldstein . |
| 4,022,927 | 5/1977 | Pfeiffer et al. . |
| 4,049,347 | 9/1977 | Smith, Jr. . |
| 4,086,073 | 4/1978 | Loukes . |
| 4,139,443 | 2/1979 | Sakurai . |
| 4,166,148 | 8/1979 | Sakurai . |

FOREIGN PATENT DOCUMENTS

| | | | |
|---|---|---|---|
| 54-51831 | 4/1979 | Japan | 430/5 |
| 56-40828 | 4/1981 | Japan | 430/5 |

OTHER PUBLICATIONS

IBM TDB "Grounding Scheme", N. S. Viswanathan, vol. 17, No. 7, 12/74, p. 1954.
IBM TDB "Multilayer Antireflective Absorption Mask", W. J. Stetson, vol. 18, No. 5, Oct. 1975, p. 1319.
IBM TDB, "Mask Substrate Surface Shields", R. S. Horwath et al., vol. 15, No. 6, Nov. 1972, p. 1727.
IBM TDB, "Structure for reduction of E-Beam Charging on Multilevel Metal Structures", J. S. Logan et al., vol. 24, No. 6, Nov. 1981, pp. 3037-3038.

*Primary Examiner*—Bruce H. Hess
*Attorney, Agent, or Firm*—Henry Powers

[57] ABSTRACT

A photomask formed of a transparent dielectric substrate, such as glass and quartz based substrates, having a conductive surface adjacent region, which is patterned with sequential overcoatings of a composite chrome oxide layer and a chrome film. The mask comprises a combination of varied reflectivities to provide proper densities for the opaque areas of the mask.

25 Claims, 5 Drawing Figures

INTEGRATED CIRCUIT PHOTOMASK

TECHNICAL FIELD

The present invention is directed to improved photomasks for lithographic processes, and more particularly to improved photomask structures for photo and electron-beam (E-beam) lithographic processing in the fabrication of semiconductor devices such as integrated circuits and large scale integrated circuits.

One object of the present invention is to provide a new and improved photomask structure.

Another object of the present invention is to provide an integrated circuit photomask characterized with substantial freedom from static charges without any significant loss of transmittance.

Another object of the present invention is to provide an improved photomask with a conductive surface with substantial elimination of proximity effects for E-beam lithography.

Another object of the present invention is to provide an optical mask with low reflectance to reduce standing wave effects.

BACKGROUND ART

The use of lithographic technology in transferring patterns from masks to semiconductor substrates in the fabrication of semiconductor devices, such as integrated circuits has been highly developed and widely used. Photomasks, such as those employed in semiconductor device fabrication, are used with a wide variety of radiation sources, both visible and ultraviolet, as well as x-rays and electron beams. An example of an electron beam system is given in Broers et al. U.S. Pat. No. 3,876,883. Other systems employing light as a radiation source are found in U.S. Pat. Nos. 3,152,938; 3,458,370; 3,712,816; and 3,758,346.

A typical mask comprises a transparent substrate, such as glass, quartz and the like, on which is coated a chromium pattern complementary to the pattern desired to be transferred to a substrate. Such mask patterns can also be formed of other compatible compositions such as chrome oxide, iron oxide, nickel and the like. These materials, as well as chromium can be prepared on a transparent substrate by conventional vacuum evaporation, sputtering techniques. However, since the reflectance of a chromium film is very high (about 40 to 60%) the resolution of a circuit pattern formed by use of the chromium mask is degraded due to multiple reflections between the surfaces of the mask and a semiconductor wafer during exposure. To overcome these problems, as so-called surface reflection-free chromium mask has been proposed, in which a chromium oxide film (of about 250 Å thickness and with anti-reflection properties) is formed over the chromium masking film. Such approaches are described in U.S. Pat. Nos. 4,139,443 and 4,178,403.

A modification of these approaches is described by W. J. Stetson in "Multilayer Antireflective Absorption Mask", p.1319 of the October 1975 issue of the IBM Technical Disclosure Bulletin, v.18, n.5. In this approach a transparent glass substrate is initially coated with a layer of $Cr_2O_3$ by any conventional method (such as sputtering in an argon-nitrogen-oxygen ambient under reduced pressure) followed by an overcoating of a normal chrome layer formed by well known techniques such as vacuum deposition, sputtering and the like.

Other methods for forming a chrome oxide coating include vapor deposition, oxidation of chrome coatings deposited as described above.

Also, a glass will typically become statically charged during handling, with even the smallest static charge attracting dust and lint particles to the glass surface. In the case of chrome plated glass photomasks, such particles, by abrasion and optical effects, will result in shorter service life and image degradation resulting in lowered process yields.

For additional background, attention is directed to U.S. Pat. No. 3,877,810 wherein the fabrication of a cobalt mask is described. This mask is formed by coating a glass plate or substrate with a conductive adhesion promoter for cobalt, as for example, stannic oxide, or $InO_2$ doped with $SnO_2$. However, retention of such a tin coating on the Mask can induce transmittance loss, is subject to degradation or removal with plasma and acid processing, as well as removal on stripping of the masking (e.g. chrome) for reprocessing to form new masks.

BRIEF DESCRIPTION OF THE DRAWINGS

In the accompanying drawings forming a material part of this disclosure.

DISCLOSURE OF THE INVENTION

Figure 1:
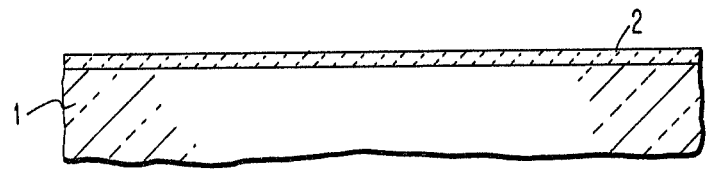
FIGS. 1 to 5 are schematic cross-sectional views illustrating various stages in the fabrication of a photomask in accordance with this invention.
Figure 2:
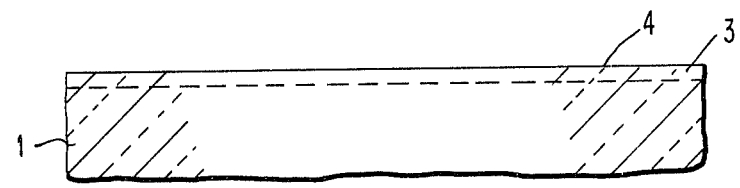
Figure 3:
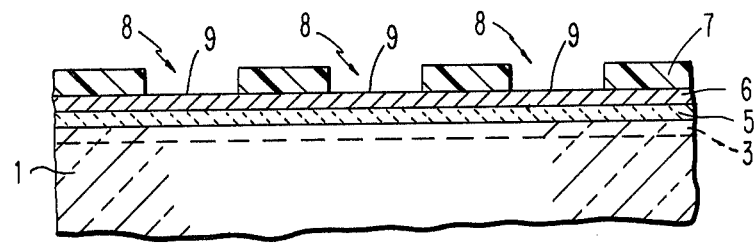
Figure 4:
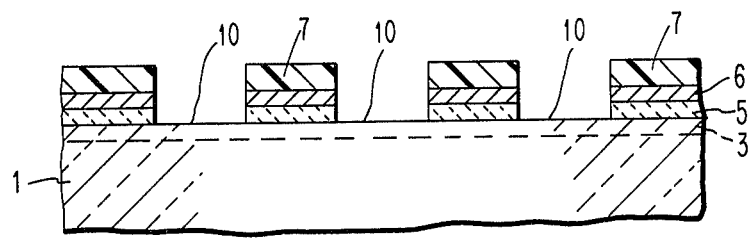

It has been discovered that a small amount of tin or tin-indium doping of a surface adjacent region of an optically transparent plate provides a permanent conductive region which will prevent static charge buildup. This conductive zone can be formed by spraying or atomizing a solution of 1 to 10 wt% stannic chloride ($SnCl_4$) in 2 parts alcohol and 1 part deionized (DI) water over the plate (e.g. glass) surface heated to about the annealing temperature of the glass. The surface is then post-heated in ambient air or $O_2$ for 5 minutes at the same temperature. In general, the amount of solution sprayed on the surface of the glass plate will determine the degree of doping, and conversely, surface conductivity. Although "conductive" glass is made commercially in a similar way, the purpose here is not to make the glass conductive per se, but only the amount necessary to prevent static charge which only requires a conductivity that is several orders of magnitude less.

Also, conventional conductive glasses have significantly lower light transmittance of about 50 to 75% as contrasted to the static-free plates of this invention which are at 95% or better (transmittance % being after doping/before doping).

The resistivity of the plate surface can be used to monitor the degree of doping, which is projected to be in the general range of about 10 to about 100 megaohm per square.

Another advantage of a conductive zone in the glass plate is that chrome mask patterns on it, can be stripped and the glass plate reprocessed without loosing the static-free aspects of the plate. Also the conductive zone of the plate is not effected by either a plasma or wet (ceramic ammonia or potassium permangate) etch.

In the next operation the plate is sequentially coated with films of chrome oxide ($Cr_2O_3$, $Cr_2O_5$ or $Cr_2O_7$) and chromium. The chrome oxide layer which is adjacent the conductive surface of the plate, is deposited to a thickness of about 1000 Å to about 1200 Å, to provide a reflectance of about 27% to about 39%, typically 33±6%. It is noted that $Cr_2O_3$ and $Cr_2O_5$ can be plasma and wet etched, whereas $Cr_2O_7$ is resistant to plasma etching. This 33% reflectance, for example, of the chrome oxide aids in minimizing the standing wave effect in resists employed in lithographic processing of semiconductor devices. As a result, images are not held whereas by going to a lower reflectivity of about 20% any improvement with the standing wave would be a disadvantage when it comes to overlay which chromium alone causes, by heating of the glass, which can give registration mismatches. In general, absorbtion plus reflection plus transmittance equals 100%. As the reflectivity of the substrate is decreased, the chrome absorbs the heat, expanding the plate at a high rate. When plates have large area of chrome versus plates with lower area of chrome being exposed (large clear or opaque area), this heat up does not give uniform expansion of the glass plate causing overlay problems. A second problem is the I.R. reflective back from the heat-up setting up the photo resist, causing problems with image size.

The bright chromium metal layer is deposited on top of the dark chrome, to a thickness of about 50 to about 100 Å, as for example 75±25 Å, to provide a reflectance of about 50 to about 65%, as for example 60%. This provides a high conducting layer that aids in discharging any static or field build-up from E-beam exposure systems. Here a 75 Å layer of chromium, (which is equivalent to 0.8 on the optical density scale) along with 1100 Å of a 33% reflective chrome oxide layer provides a minimum of 3.0 density for the chrome oxide/chromium package. An effective density range resulting from the indicated thickness variations of chrome oxide/chromium can extend in the range of 3.0 to 4.0. Also the effective total reflectance of the composite chrome oxide/chromium films will be in the range of about 27 to 39%.

The desired masking pattern can be delineated in the composite chrome oxide/chrome by optical or E-beam lithography utilizing positive or negative resists to provide a resist mask complementary to the openings desired, at which areas the composite chromium/chrome oxide is sequential wet or dry etched in accordance with conventional techniques. It may be noted that in etching the composite chromium/chrome oxide, it is permissible to slightly etch (for example, about 1000 Å) into the conductive region of the glass plate (ghosting).

It is also noted, that a further advantage of the photomasks of this invention is that it may be used in E-beam verification of mask pattern where the chromium layer would give one signal (volts) back and the conductive glass another.

BEST MODE FOR CARRYING OUT THE INVENTION

The photomask of this invention is comprehended to utilize a polished planar-parallel transparent dielectric plate or substrate 1 of quartz. However, as is to be understood, the plate 1 can also be formed of other dielectric transparent materials such as glass, e.g. borosilicate glass.

After cleaning in accordance with well known techniques, as for example ultrasonically in acetone, alcohol and warm DI water, a surface of plate 1 is spray coated with a layer 2 a solution of 1 to 10 wt% stannic chloride ($SnCl_4$) in 2 parts ethyl alcohol (ethyl is preferred, but any alcohol with high vapor pressure can be used) and 1 part DI water with the plate heated from about 400° to about 600° C. (for example above the annealing temperature of glass). The surface can then be post-heated at the same temperature for 1-10 minutes in ambient air or $O_2$. It is postulated that tin salt reduces on the substrate surface where it reacts by solution diffusion mechanism to provide the gradient conductive region 3 adjacent the plate surface 4. Although not critical, the depth of zone or region 3 is about 500 Å to about 5000 Å, typically.

Alternately the conductive region 3 can be formed by sputter deposition or vacuum evaporation of a tin-indium layer 2 at 300°-400° C., followed by heating in $O_2$ atmosphere to form the conductive region 3.

The basic process as well as other processes for the formation of the conductive glass can be found in U.S. Pat. Nos. 2,919,212; 3,019,136; 3,436,257; 3,607,177; 3,877,810 and 4,086,073.

In the next step, a chrome oxide (e.g. $Cr_2O_3$, $Cr_2O_5$ or $Cr_2O_7$) layer 5 is formed over the plate surface by sputter deposition from a $Cr_xO_y$ source or by use of an enriched or $O_2$ plasma. Alternately, the chrome oxide layer 5 can be formed by vacuum evaporation utilizing $Cr_xO_y$ as a source material or by vacuum evaporation in which chromium is evaporated in a vacuum under a pressure of oxygen of from $10^{-4}$ to $10^{31\ 6}$ torr. A conventional chromium evaporator can be used with an oxygen bleed valve for admission operating pressures. The operation is controlled so that the thickness of the chrome oxide layer 5 will be in the range of 1000 Å to about 1200 Å, corresponding to a reflectance of about 27% to about 39%, preferably 33±6%.

Another method for forming the chrome oxide layer by spray coating can be found in U.S. Pat. No. 2,919,212.

The chrome oxide layer 5 is subsequently overcoated with a chromium metal film 6, which can be effected in the same vacuum evaporation unit with the bleed valve closed and the unit purged. Alternately, the chromium film 6 can be formed by sputter deposition. The chromium film 6 will be deposited to a thickness of about 50 Å to about 100 Å, as for example 75±25 Å, corresponding to a reflectance of about 50 to about 65%. These composite chromium/chrome oxide films or layers 6/5 will provide a total reflectance of about 27 to about 39%. Also this composite will provide an optical density of at least 3.0 (which is approximately 0.01 transmittance), which will prevent passage of UV light.

The plate structure is then covered, over chromium film 6, with a blanket layer 7 of a standard resist material by any well known process, such as spin coating, dip coating, roller coating, spray coating and the like. Positive and negative resists can be used, preferably the positive resists such as a cresol formaldehyde resin containing an o-quinone-diazide commercially available as Shipley's AZ-1350. Illustrative of the negative resists is KTFR of Kodak which comprises a polyvinyl cinnamate.

Figure 5:
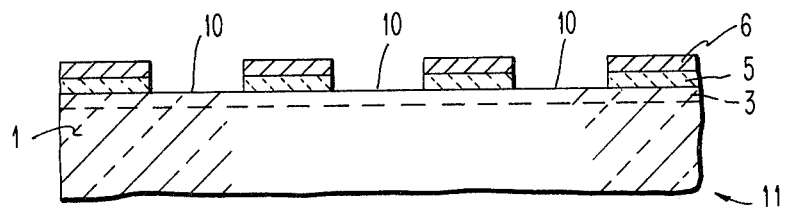

The pattern of openings 8 is formed in resist layer 7 by conventional exposure and development techniques such as uv, x-ray and electron beam lithographic techniques, optionally preferred by programmed control of the radiation beam. The resist mask 7 is them employed for removal of the exposed chromium/chromide oxide composite areas 9 by wet or dry etching techniques. These exposed composite regions 9 can be removed by chemical etching, sputter etching, plasma etching, reactive ion etching or other suitable means to provide the transparent regions 10 of the photomask 11 shown in FIG. 5. By having a bright chrome/non-oxide chrome on the top surface it aids in the removal of the total metallic surface to be removed. Chrome is removed by oxidation, chemical or plasma/reactive ion etching. By not having the chrome oxide on the top surface it allows for the chemical reaction to take place without getting or making the surface a ($Cr_3O_7$) chrome oxide that cannot be removed if the initial reaction is slow and not complete. In the etching of the composite region 9, it is permissible to etch slightly into the conductive region 3 (ghosting) which does not remove all of the conductive layer at the etched regions. Such etching of the conductive region 3 can be, illustratively about 1000 Å. In general the conductive region is resistant to etching, and is generally not effected by either plasma etching or wet etching (ceric ammonia). Other known wet etching systems can also be used, such as potassium permangate and acid etches.

The resultant photomask 11 is characterized with a conductive surface which minimizes proximity effects in E-beam exposure. Also the photomask provides a conductive glass surface to provide a signal return for E-beam mask inspection. In addition, the low reflectivity (@ 33%) of the photomask minimizes standing wave effects for optical lithography. Further, the photomask 11 controls contamination by virtue of the conductive region 3 which on grounding zeros out all static charges that attract contamination. Also, by having the chromium layer 6 overlying the chrome oxide layer 5, undercutting is prevented during etching of the composite, in contrast to the reverse order where a two cycle etch would be required to minimize undercutting of the chromium layer.

As indicated above, the chromium layer 6 is about 50%+ reflective for a thickness of 50 to 100 Å, which in addition provides a high conductive layer to aid in discharging any static charge or field build up from E-beam exposure systems. Also the indicated thickness of the chromium layer 6 provides an optical density of 0.8 when in combination with the 33% reflective chrome oxide layer 5 gives a minimum density of 3.0 (approximately 0.01 transmittance) for the total chromium/chrome oxide composite. The +3.0 density is required for deep ultraviolet exposure systems, which clocks rays below 300 nm, from getting through the opaque (chromium/chrome oxide) areas.

While the invention has been illustrated and described with respect to preferred embodiments of this invention, it is to be understood that the invention is not limited to the precise construction herein disclosed and the right is reserved to all changes and modifications coming within the scope of the invention as defined in the appended claims.

Having thus described the invention, what is claimed as new, and desired to be secured by Letters Patent is:

1. A photomask comprised of a transparent dielectric having a tin or tin-indium doped conductive zone therein coextensive with a surface thereof and a minimum transmittance of about 95%; and a mask on said surface and having a predetermined pattern of opaque extensions delineating a desired pattern of complementary transparent areas through said substrate.

2. The photomask of claim 1 wherein said substrate is selected from glass and quartz based substrates.

3. The photomask of claim 2 wherein said zone comprises a tin doped region, said tin displacing oxygen in said substrate.

4. The photomask of claim 3 wherein said mask comprises a first film on said surface and adjacent said zone, and wherein said first film has a reflectance of 33%±6%.

5. The photomask of claim 4 wherein said mask includes a transparent and conductive second film on top of said first film, and wherein said second film has a minimum reflectance of 50%, with the total reflectance of said first and second films in the range of 27 to 39%.

6. The photomask of claim 5 wherein said first and second films have a combined minimum optical density of at least 3.

7. The photomask of claim 1 wherein said pattern comprises a first film on and adjacent said surface, with said first film selected from the group of $Cr_2O_3$, $Cr_2O_5$, and $Cr_2O_7$; and a transparent chromium second film on said first film.

8. The photomask of claim 7 wherein said substrate is selected from glass and quartz based substrates.

9. The photomask of claim 8 wherein said zone comprises a tin doped region, said tin displacing oxygen in said substrate.

10. The photomask of claim 9 wherein said first film has a reflectance of 33%±6%.

11. The photomask of claim 10 wherein said second film has a minimum reflectance of 50%, with the total reflectance of said first and second films in the range of 27 to 39%.

12. The photomask of claim 9 wherein said first and second films have a combined minimum optical density of at least 3.

13. A photomask comprising a transparent dielectric substrate having a tin or tin-indium doped conductive zone therein coextensive with and adjacent to and contiguous with a surface of said substrate with said substrate having a minimum transmittance of about 95% and an opaque mask on said surface defining a predetermined complementary pattern of transparent areas in said mask.

14. The photomask of claim 13 wherein said substrate is selected from glass and quartz based substrates.

15. The photomask of claim 14 wherein said zone comprises a tin doped region, said tin displacing oxygen in said substrate.

16. The photomask of claim 15 wherein said mask comprises a first film on said surface and adjacent said zone, and wherein said first film has a reflectance of 33%±6%.

17. The photomask of claim 16 wherein said mask includes a transparent conductive second film on top of said first film, and wherein said second film has a minimum reflectance of 50%, with the total reflectance of said first and second films in the range of 27 to 39%.

18. The photomask of claim 17 wherein said first and second films have a combined minimum optical density of at least 3.

19. A photomask comprised of a transparent dielectric substrate; a first film on a surface of said substrate and selected from the group consisting of $Cr_2O_3$ and $Cr_2O_5$, a second film of chromium on said first film; and a tin or tin-indium doped transparent conductive region in said substrate coextending with said surface, thereof and adjacent said first film with said substrate having a minimum transmittance of about 95%.

20. A photomask adapted for E-beam lithography comprised of
- a transparent dielectric substrate having formed therein a surface-adjacent coextending internal region doped with tin converting said region into a transparent electrically conductive layer contiguous with said surface, with said region spaced from the opposite surface of said substrate with said substrate having a minimum transmittance of about 95%;
- a first film on said first surface adjacent said region, with said film selected from the group consisting of $Cr_2O_3$ and $Cr_2O_5$; and
- a chromium second film over said first film.

21. The photomask of claim 20 wherein said first and second films are coextensively delineated in a predetermined pattern of opaque and transparent areas on said substrate.

22. The photomask of claim 21 wherein said substrate is selected from the glass and quartz based substrates, with said tin displacing oxygen in said substrates.

23. The photomask of claim 22 wherein said first film has a reflectance of 33%±6%.

24. The photomask of claim 23 wherein said second film has a thickness of about 50 to about 100 Å and a minimum reflectance of 50%, with the total reflectance of said first and second films in the range of 27 to 39%.

25. The photomask of claim 22 wherein said first and second films have a combined minimum optical density of at least 3.

* * * * *